United States Patent [19]

Tateishi et al.

[11] 4,405,435
[45] Sep. 20, 1983

[54] APPARATUS FOR PERFORMING CONTINUOUS TREATMENT IN VACUUM

[75] Inventors: Hideki Tateishi, Yokohama; Tsuneaki Kamei, Kanagawa; Katsuo Abe, Yokosuka; Shigeru Kobayashi, Kawasaki; Susumu Aiuchi, Yokohama; Masashi Nakatsukasa, Tama; Nobuyuki Takahashi, Mitaka; Ryuji Sugimoto, Sagamihara, all of Japan

[73] Assignees: Hitachi, Ltd.; Anelva Corporation, both of Tokyo, Japan

[21] Appl. No.: 296,314

[22] Filed: Aug. 26, 1981

[30] Foreign Application Priority Data

| Aug. 27, 1980 | [JP] | Japan | 55-117069 |
| Aug. 27, 1980 | [JP] | Japan | 55-117070 |
| Oct. 3, 1980 | [JP] | Japan | 55-137802 |
| Oct. 3, 1980 | [JP] | Japan | 55-137804 |

[51] Int. Cl.³ .............................. C23C 15/00
[52] U.S. Cl. .................... 204/298; 118/719; 136/258
[58] Field of Search ............. 118/719; 204/298; 136/258 PC

[56] References Cited

U.S. PATENT DOCUMENTS

| 3,584,847 | 6/1971 | Hammond | 204/298 |
| 3,968,018 | 7/1976 | Lane et al. | 204/298 |
| 4,015,558 | 4/1977 | Small et al. | 118/719 |
| 4,274,936 | 6/1981 | Love | 204/298 |

OTHER PUBLICATIONS

Barber, IBM Tech. Disc Bull. 11 (1968), p. 757.

*Primary Examiner*—Arthur P. Demers
*Attorney, Agent, or Firm*—Antonelli, Terry & Wands

[57] ABSTRACT

An apparatus for performing continuous treatment in vacuum including an inlet chamber, a first intermediate chamber, at least one vacuum treating chamber, a second intermediate chamber and a withdrawing chamber arranged in the indicated order in a direction in which base plates are successively transferred. An opening device normally closed and opened when a base plate is transferred therethrough is mounted on a wall at the inlet of the inlet chamber, between the adjacent chambers and on a wall at the outlet side of the withdrawing chamber. A conveyor device for conveying each base plate in a horizontal direction through the opening device is mounted in each of the chambers, and an evacuating device is also mounted in each chamber. A base plate storing device for storing a plurality of base plates in a magazine is mounted in the first and second intermediate chambers. At least one vacuum treating device is mounted in the vacuum treating chamber.

12 Claims, 9 Drawing Figures

APPARATUS FOR PERFORMING CONTINUOUS TREATMENT IN VACUUM

FIELD OF THE INVENTION

This invention relates to an apparatus for performing continuous treatment in vacuum for carrying into practice a process for performing continuous treatment in vacuum which is used in connection with a continuous sputtering apparatus for continuously depositing a thin film on elements of semiconductor wafers, magnetic discs, communication devices, etc.

DESCRIPTION OF THE PRIOR ART

A continuous sputtering apparatus of the prior art will be described by referring to FIGS. 1 and 2. The apparatus uses a base plate supported beforehand by a conveyor jig means, such as a pallet. As shown in FIG. 2, the conveyor jig means 1 comprises two members 1a and 1b in the form of a letter C in cross section disposed in spaced juxtaposed relation which are formed with grooves 2, 2 respectively for receiving a base plate 3 fitted therein.

Figure 1:
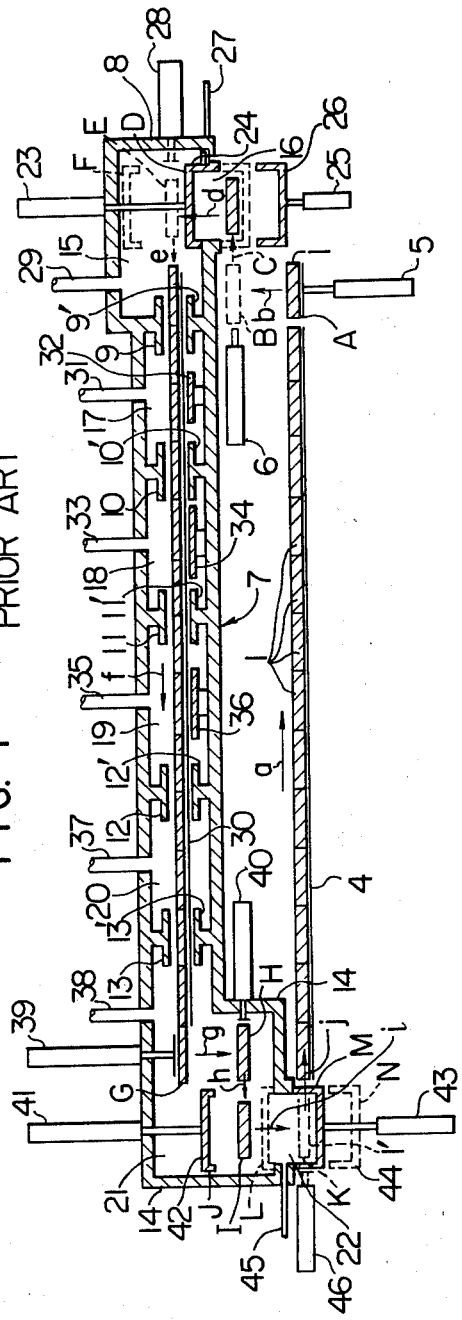
FIG. 1 is a transverse sectional plan view of a sputtering apparatus of the prior art.
Figure 2:
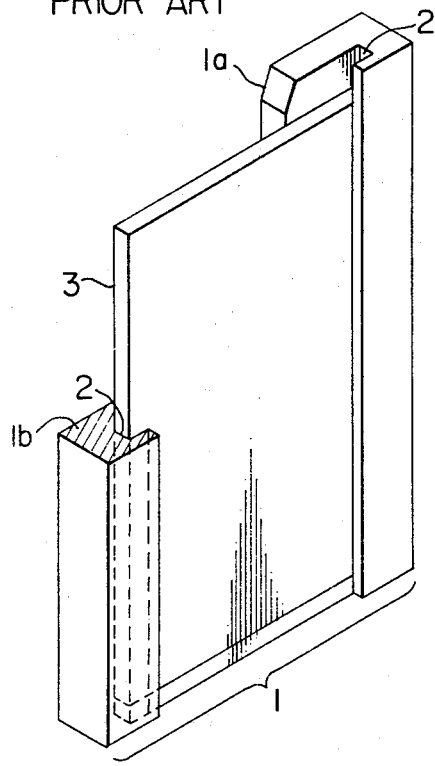
FIG. 2 is a perspective view of an assembly of a base plate and a jig fed to the apparatus shown in FIG. 1.

The sputtering apparatus of the prior art comprises, as shown in FIG. 1, rails 4 for transferring the conveyor jig means 1, (hereinafter referred to as a jig), such as a pallet, which has the base plate 3 fitted therein as aforesaid, a sealed casing 7, an inserting section for inserting the jig 1 in an inlet chamber 15 of the sealed casing 7 by hydraulic cylinders 5 and 6 cooperating with each other, and a withdrawing section for withdrawing from a withdrawing chamber 21 of the sealed casing 7 the jig 1 having the base plate that has been treated.

The sealed casing 7 includes, arranged in the order of the steps for treating the base plate supported in the jig 1, the inlet chamber 15, a sputter-etching chamber 17, a heating chamber 18, a sputtering chamber 19, a cooling chamber 20 and the withdrawing chamber 21 defined by a side wall 8, partition walls 9, 9', 10, 10', 11, 11', 12, 12', 13 and 13' and a side wall 14. A reserve inlet chamber 16 is formed in a side wall of the inlet chamber 15 close to the rails 4. The inlet chamber 15 has mounted therein a hydraulic cylinder 23 having a sealing lid 24 for the reserve inlet chamber 16 which has a pallet, not shown, for the jig 1. Located outside the inlet chamber 15 is a hydraulic cylinder 25 having another sealing lid 26 for the reserve inlet chamber 16, the inlet chamber 15 having a hydraulic cylinder 28 at the side wall 8 for forcing the jig 1 horizontally from a predetermined position in the inlet chamber 15 toward transfer surfaces on rails 30. In the reserve inlet chamber 16, a pipe 27 is mounted, while in the inlet chamber 15, an exhaust pipe 29 is mounted. The rails 30 for transferring the jig are layed inside the sealed casing 7 and extend from a position which is almost in the inlet chamber 15 to a position which is almost in the withdrawing chamber 21 after passing through the partition walls 9, 9' to 13, 13'. The sputter-etching chamber 17 has mounted therein an exhaust pipe 31 and a sputter-etching electrode 32, and the heating chamber 18 has an exhaust pipe 33 and heaters 34 mounted therein. The sputtering chamber 19 has an exhaust pipe 37 and a cooling pipe, not shown, arranged on the rails 30. A sputtering gas is introduced into the sputter-etching chamber 17 and the sputtering chamber 19. A reserve withdrawing chamber 22 is formed leftwardly of the withdrawing chamber 21 as viewed leftwardly from the direction in which the jig 1 is transferred. The withdrawing chamber 21 has mounted therein an exhaust pipe 38 and a hydraulic cylinder 39 receiving the jig 1 from the transfer surfaces on the rails 30 for transporting same to a predetermined position which is leftwardly as viewed from the direction of transfer on the rails 30. A hydraulic cylinder 40 for pressing the jig 1 in the predetermined position horizontally is mounted on a side wall 14'. Mounted in the withdrawing chamber 21 is a hydraulic cylinder 41 having a sealing lid 42 for the reserve withdrawing chamber 22 which has a pallet, not shown, for the jig 1 mounted forwardly thereof with respect to the direction in which the base plate is transferred. A hydraulic cylinder 43 having a sealing lid 44 for the withdrawing chamber 22 is mounted outside the withdrawing chamber 21, and the reserve withdrawing chamber 22 has a pipe 45 mounted therein. A hydraulic cylinder 46 for forcing the jig 1 out of the sealed casing 7 is mounted outside the reserve withdrawing chamber 22 which is the section for withdrawing the jig 1 supporting the base plate that has been treated. Vacuum pumps, not shown, are connected to the exhaust pipes 29, 31, 33, 35, 37 and 38, and the pipes 27 and 45 are interchangeably connected to vacuum pumps, not shown, and the atmosphere. The chambers are evacuated to degrees different from one another and are in dynamic equilibrium condition which may vary depending on the conductance (the value indicating the ease with which a gas flows) measured in gaps formed between the chambers and the jig 1 successively transferred through the partition walls 9, 9' to 13, 13', the flow rate of a sputtering gas introduced into the sputter-etching chamber 17 and the sputtering chamber 19, and the speed at which the fluid is exhausted through the exhaust pipe of each chamber. In the apparatus of the prior art of the aforesaid construction, the jig 1 supporting the base plate is placed on the rails 4 outside the sealed casing 7 and transferred in the direction of an arrow a.

Then the jig 1 is moved from position A to position B in the direction of an arrow b by the hydraulic cylinder 5 mounted in the inserting section which is away from the forward end portions of the rails 4, and forced to move in the direction of an arrow c by the hydraulic cylinder 6, so that it is transferred to position C in the reserve inlet chamber 16 which is closed at the inlet chamber side by the sealing lid 24 driven by the hydraulic cylinder 23 mounted in the inlet chamber 15 before being placed on a pallet supported on the sealing lid 24.

At the time the jig 1 is inserted in position C, the hydraulic cylinder 25 mounted outside the inlet chamber 15 is actuated, to seal the reserve inlet chamber 16 with the sealing lids 24 and 26 and contain the jig 1 in the sealed chamber. At the same time, the reserve inlet chamber 16 is exhausted substantially to the same degree as the inlet chamber 15 through the pipe 27.

When the sealed chamber is rendered vacuum, the pallet and the jig 1 are moved in the direction of an arrow d to position E in the inlet chamber 15, and the sealing lid 24 is moved in the direction of the arrow d to position F.

At the time the jig 1 is moved to position E, the hydraulic cylinder 28 mounted on the side wall 8 of the inlet chamber 15 is actuated to force the jig 1 in the direction of an arrow e and place same on the rails 30. The result of this is that the jig 1 placed on the rails 30 is transferred pitch by pitch in the direction of an arrow f. After the jig 1 is forced on to the rails 30 from position E, the sealing lids 24 and 26 are restored to their original positions indicated by solid lines.

In the sputter-etching chamber 17, a voltage is impressed between the sputter-etching electrode 32 and the base plate supported by the jig 1, to give an impact to the surface of the base plate with an ionized sputtering gas, to effect sputter-etching of the surface of the base plate to remove minuscule foreign matters adhering thereto.

Then in the heating chamber 18, the base plate is heated by heaters 34, to cause impure gases adsorbed on the surface of the base plate and absorbed in the interior of the base plate to be released therefrom and to raise the temperature of the base plate to a level suitable for sputtering treatment.

Then in the sputtering chamber 19, an impact by means of an ionized gas of the different sign from that of the ionized gas used for sputter-etching is given to the base plate, to subject the base plate to sputtering treatment for causing a sputtering material of the sputtering electrode 36 to adhere to the base plate.

Thereafter the base plate is cooled in the cooling chamber 20, and a jig 1' supporting the base plate subjected to sputtering treatment as planned is supplied to the withdrawing chamber 21.

In the withdrawing chamber 21, the jig 1' transferred to position G is fed by the hydraulic cylinder 39 in the direction of an arrow g to move same to position H. Then the jig 1' is fed by the hydraulic cylinder 40 from position H in the direction of an arrow h, to transfer same to position I on the pallet provided to the sealing lid 42 attached to the hydraulic cylinder 41.

Then the hydraulic cylinder 41 is actuated to move the sealing lid 42 with the pallet and jig 1' in the direction of an arrow i from position J, I shown in solid lines to position L, K shown in broken lines.

At this time, an outer opening of the reserve withdrawing chamber 22 is closed by the sealing lid 44 attached to the hydraulic cylinder 43, so that as the inner sealing lid 42 moves to position L, the reserve withdrawing chamber 22 is closed with the jig 1' being located in the sealed chamber. Air is introduced from the atmosphere into the sealed chamber through the pipe 45, to render the internal pressure of the reserve withdrawing chamber 22 atmospheric. Thereafter the sealing lid 44 is moved by means of the hydraulic cylinder 43 from position M to position N.

The hydraulic cylinder 46 in the withdrawing section is then actuated to move in the direction of an arrow j the jig 1' in position K on the pallet to place same on the rails 4, to withdraw the jig 1' having the base plate subjected to sputtering, thereby completing a series of operations.

The aforesaid series of operations are repeated, to subject one base plate after another to sputtering.

Some disadvantages are associated with the apparatus of the aforesaid construction of the prior art. The arrangement whereby a base plate supported by a jig is subjected to sputtering inevitably brings into the sputtering chamber impure gases adhering to the jig in the atmosphere, thereby raising the impure gas partial pressure and adversely affecting the quality of the film formed on the base plate. Moreover, since the thermal capacity of a jig is higher than that of a wafer, the time required for effecting heating and cooling is prolonged. The jig is of larger dimensions than the wafer, so that the apparatus to a whole becomes large as compared with an apparatus using no jig. The operation is performed on base plates continuously by treating one base plate as a unit, and consequently the reserve inlet chamber is evacuated each time one base plate is introduced thereinto. Thus in many cases, the time required for evacuating the chamber becomes longer than the time required for the treatments given to the base plate. This places limitations on the cycle time of the apparatus, making it impossible to increase production speed. The jigs are transferred from the inlet chamber to the withdrawing chamber in a tact system of one pattern, so that difficulties are experienced to thoroughly heat the base plates which usually require a prolonged holding of the base plates at high temperature. Last but not least important is that the vacuum system becomes complex because all the chambers are evacuated independently of each other.

SUMMARY OF THE INVENTION

This invention has been developed for the purpose of obviating the aforesaid disadvantages of the prior art. Accordingly the invention has as its object the provision of an apparatus for performing continuous treatment in vacuum capable of depositing a thin film of high quality in a stable manner on each base plate which is high in productivity and enables a compact overall size to be obtained in an apparatus of the type described.

In one feature of the invention, the apparatus comprises, arranged in the direction in which base plates are transferred, an inlet chamber for the base plate, a first intermediate chamber therefor, at least one chamber for performing sputtering or other treatment in vacuum, a second intermediate chamber and a withdrawing chamber. Opening means are provided in a side wall on the inlet side of the inlet chamber, between the chambers and in a side wall on the outlet side of the withdrawing chamber for providing openings only when a base plate passes therethrough. Each chamber has mounted therein conveyor means for conveying each base plate horizontally through the opening means between the adjacent chambers, and vacuum means. The first and second intermediate chambers have base plate containing means mounted therein, and the chamber for performing sputtering or their treatment has mounted therein at least one sputtering means or other means for performing treatment in vacuum. By virtue of this construction, it is possible to deposit thin films of high quality in a stable manner on the base plates continuously with high productivity. More specifically, the conveyor means conveys each base plate by itself without using a conveyor jig means, thereby enabling impure gases brought into the chamber for performing treatment in vacuum from the atmosphere to be reduced in amount. The apparatus can accommodate changes in the size of base plates without any trouble, thereby avoiding a reduction in productivity.

In another feature of the invention, base plate raising means capable of bringing each base plate to a substantially upright position in which the base plate is in face-to-face relation to the sputtering means is mounted in the chamber for performing sputtering which is formed as a chamber for performing treatment in vacuum. By virtue of this feature, foreign matters that are deposited on the base plates can be reduced in amount and a thin film of uniform thickness can be deposited on each base plate.

In still another feature of the invention, the chamber for performing sputtering comprises a sputtering chamber, a sputter-etching chamber for forming a thin film of metal, such as aluminum, on a bipolar IC, etc., by performing sputtering in unlike sign on a base plate to sputter-etch same before sputtering is performed on the base plate in the sputtering chamber, and a cooling chamber for cooling the base plate on which sputtering has been performed in the sputtering chamber. In the case of an MOS IC, however, there is no need to perform sputter-etching.

In accordance with a further feature of the invention, each base plate is subjected by itself to baking treatment by means of a heater, to enable sputtering to be performed with aluminum or the like without the risk of incorporation of impurities. By virtue of this feature, the disadvantage that variations would occur in the results of baking treatment to which the base plates are subjected when they are treated in a batch can be eliminated.

DETAILED DESCRIPTION OF THE PREFERRED EMBODIMENTS

Figure 4:
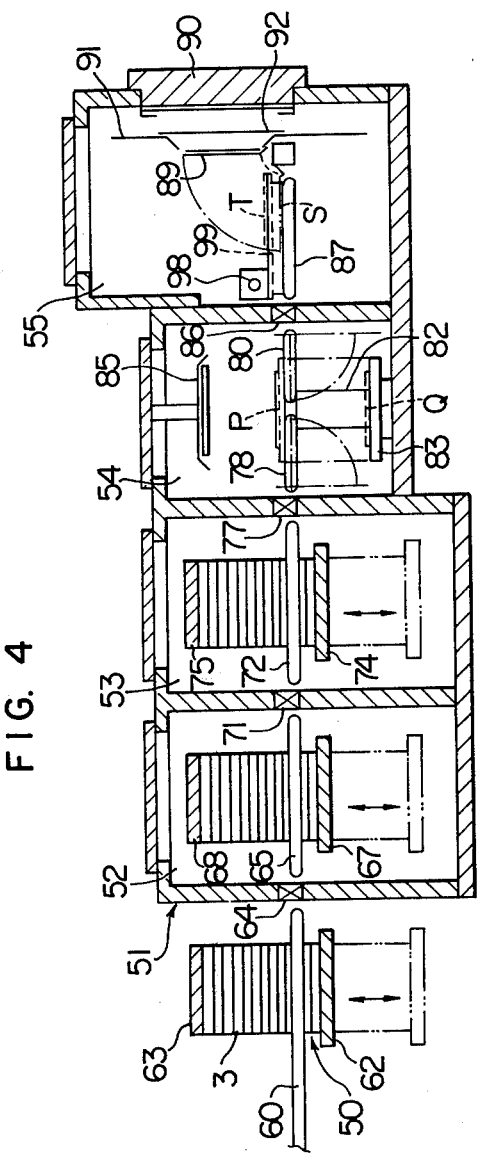
FIG. 4 is a sectional view taken along the line IV—IV in FIG. 3.
Figure 5:
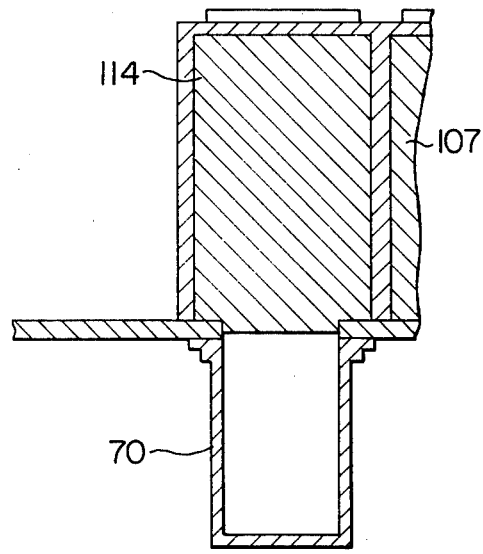
FIG. 5 is a sectional view taken along the line V—V in FIG. 3.
Figure 3:
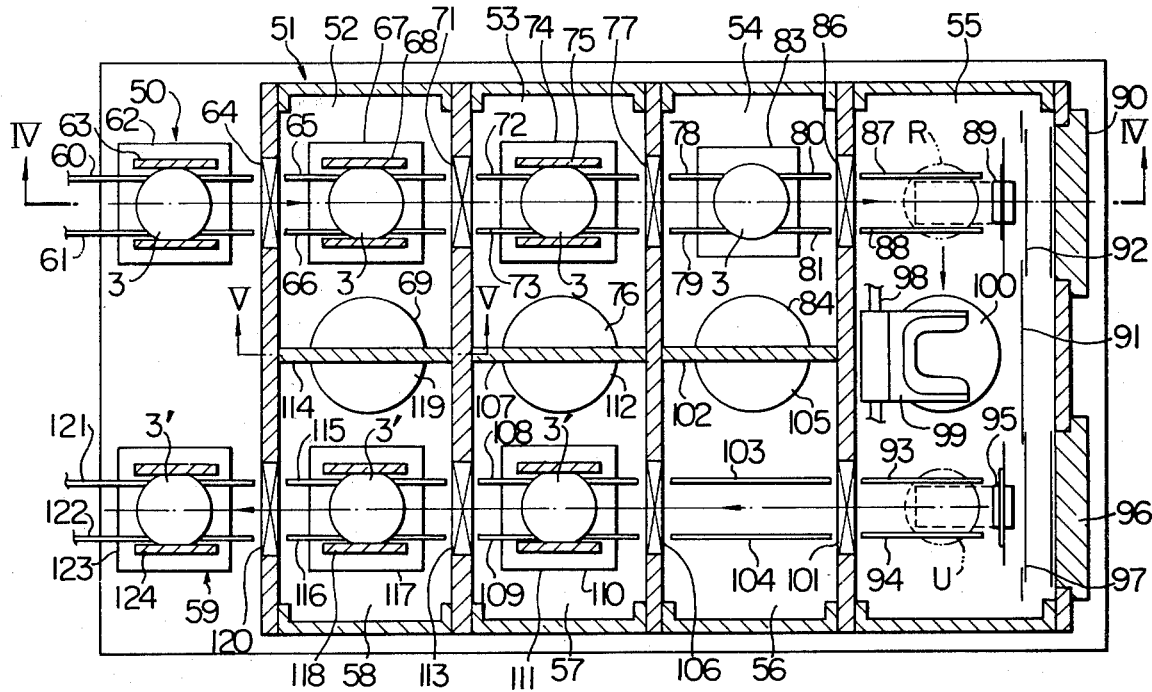
FIG. 3 is a transverse sectional view of the sputtering apparatus according to an embodiment of the invention.

FIGS. 3, 4 and 5 show one embodiment of the invention. In a sealed casing 51, an inlet chamber 52, a first intermediate chamber 53, a sputter-etching chamber 54, a sputtering chamber 55, a cooling chamber 56, a second intermediate chamber 57 and a withdrawing chamber 58 are arranged successively in the direction of movement of a base plate 3 to be treated. As viewed in plan view, these chambers are arranged in the form of a letter U in a lying position. A first outside storing means 50 is located outside the sealed casing 51 on the side of the inlet chamber 52, while a second outside storing means 59 is located outside the sealed casing 51 on the side of the withdrawing chamber 58.

The first outside storing means 50 comprises a pair of conveyor belts 60 and 61, and a cassette elevator 62 having a base plate cassette 63. The cassette elevator 62 is connected to a drive source, not shown, which may comprise a motor and a ball screw in combination. The cassette 63 is constructed such that it can contain base plates 3 on shelves arranged in vertically spaced relation. In the first outside storing means 50 of the aforesaid construction, the base plates to be treated are directly placed on the conveyor belts 60 and 61 by themselves and not supported by jigs, and the base plates 3 are conveyed to the position in which the cassette elevator 62 is located, to be placed on the shelves of the cassette 63. Each time one base plate 3 is placed on one of the shelves in the base plate cassette 63, the cassette elevator 62 is intermittently moved upwardly a distance corresponding to one pitch of the shelves to place a predetermined number of base plates 3 in the cassette 63. After the predetermined number of base plates 3 are placed on the shelves of the cassette 63, the cassette elevator 62 operates in cooperation with the conveyor belts 60 and 61, to feed one base plate 3 after another from the cassette 63 to the inlet chamber 52.

A gate valve 64 is mounted between the first outside storing means 50 and the inlet chamber 52 or on an inlet side wall of the inlet chamber 52 and comprises a hydraulic cylinder, not shown, which is adapted to open when the base plate 3 is introduced into the inlet chamber 52 by the conveyor belts 60 and 61.

The inlet chamber 52 has mounted therein a pair of conveyor belts 65 and 66, a cassette elevator 67 having a cassette 68, an exhaust port 69 communicating with a vacuum pump 70 as shown in FIG. 5, a heater and an atmosphere leak means. The heater and the atmosphere leak means are not shown. The cassette elevator 67 and the base plate cassette 68 are of the same construction as the cassette elevator 62 and the base plate cassette 63 respectively of the first outside storing means 50. One base plate 3 after another is fed to the inlet chamber from the conveyor belts 60 and 61 of the first outside storing means 50 by the pair of belt conveyors 65 and 66 through the gate valve 64, and placed on each shelf of the base plate cassette 68 by means of the cassette elevator 67. After a predetermined number of base plates 3 are placed in the cassette 68, the gate valve 64 is closed, and the inlet chamber 52 is evacuated through the exhaust port 69 to introduce thereinto a vacuum of about $10^{-5}$ Torr. Then baking of the base plate 3 is effected by actuating the heater to degass the base plates 3, and thereafter one base plate 3 after another is fed from the base plate cassette 68 to the first intermediate chamber 53 by the cassette elevator 67 in cooperation with the conveyor belts 65 and 66. The baking can thus be advantageously effected in the sputter-etching chamber 54 or a newly installed chamber, not shown, between the first intermediate chamber 53 and the sputter-etching chamber 54, for example, with regard to one base plate 3 after another, rather than in the inlet chamber 52 with regard to a large number of base plates 3 in a batch, to permit the baking to be effected uniformly without any variation.

A gate valve 71 is mounted between the inlet chamber 52 and the first intermediate chamber 53 and has the same construction as the gate valve 64 referred to hereinabove.

In the first intermediate chamber 53, a pair of conveyor belts 72 and 73, a cassette elevator 74 having a base plate cassette 75, an exhaust port 76 communicating with a vacuum pump and a gas inlet means. The vacuum pump and the gas inlet means are not shown. The cassette elevator 74 and the base plate cassette 75 are of the same construction as the cassette elevator 62 and the base plate cassette 63 respectively of the first outside storing means 50. By adjusting the flow rate of gas, such as $N_2$ gas introduced through the gas inlet means, that does not affect the sputtering, and the velocity at which evacuation is effected by the vacuum pump connected to the exhaust port 76, the internal pressure of the intermediate chamber 53 can be rendered substantially equal to that of the inlet chamber 52 or about $10^{-5}$ Torr, for example. Then the gate valve 71 is opened and one base plate 3 after another is received from the conveyor belts 65 and 66 of the inlet chamber 52 through the gate valve 71 and placed on the shelves of the cassette 75 through the action of the cassette elevator 74. After a predetermined number of base plates 3 are placed, the gate valve 71 is closed and the internal pressure of the first intermediate chamber 53 is rendered substantially equal to the pressure in the sputter-etching chamber 54 or about $10^{-3}$ Torr, for example, by adjusting the flow rate of the gas introduced through the gas inlet means and the velocity at which evacuation is effected by the vacuum pump communicating with the exhaust port 76. Then by the cassette elevator 74 cooperating with the conveyor belts 72 and 74, one base plate 3 after another can be fed from the base plate cassette 75 to the sputtering chamber 54.

When the gate valve 71 between the inlet chamber 52 and the first intermediate chamber 53 is opened, the internal pressure of the first intermediate chamber 53 may be rendered higher than the internal pressure of the inlet chamber 52, to avoid introduction of $H_2O$, $O_2$ and other gases that might adversely affect the sputtering or dust into the first intermediate chamber 53 from the inlet chamber 52. Also, the internal pressure of the first intermediate chamber 53 may be rendered about $10^{-6}$ Torr which is slightly lower than the internal pressure of the inlet chamber 52 which is $10^{-5}$ Torr, and the gate valve 77 may be opened even if there is introduction of gases or dust to a certain degree, so as to exhaust the gases and dust by the pressure of $10^{-6}$ Torr before the base plates 3 are fed to the sputter-etching chamber 53.

The gate valve 77 is mounted between the first intermediate chamber 53 and the sputter-etching chamber 54 and has the same construction as the gate valve 64.

In the sputter-etching chamber 54, a pair of conveyor belts 78 and 79, another pair of conveyor belts 80 and 81, an elevator 82, a sputter-etching electrode 83, an exhaust port 84 communicating with a vacuum pump, an inlet means for argon gas, for example, and a heater 85 are mounted. The vacuum pump and the gas inlet means are not shown. As shown in FIG. 4, the conveyor belts 78, 79, 80 and 81 are arranged in the same horizontal plane close to one another and can pivotally move from a horizontal position in a vertical direction with the outer end side thereof serving as a pivot. As shown in FIG. 4, the elevator 82 first causes the base plate 3 conveyed by the conveyor belts 78, 79, 80 and 81 to the central portion of the sputter-etching chamber 54 to a position P which is higher than the conveyor surfaces of the conveyor belts 78, 79, 80 and 81, and then causes the base plate 3 to descend to a position Q on a sputter-etching electrode 83 after the conveyor belts 78, 79, 80 and 81 have pivotally moved in the vertical direction. The sputter-etching electrode 83 is located in a lower portion of the sputter-etching chamber 54 and the heater 85 is located in an upper portion thereof. The sputter-etching chamber 54 is maintained in dynamic equilibrium at a constant pressure, such as $10^{-3}$ Torr, which may vary depending on the flow rate of a sputtering gas introduced through the means for introducing gas, such as argon gas, and the speed at which evacuation is effected by the vacuum pump communicating with the exhaust port 84. From the conveyer belts 72 and 73 of the first intermediate chamber 53, one base plate 3 is fed by the conveyor belts 78 and 79 through the gate valve 77 to the sputter-etching chamber 54 and conveyed by the conveyor belts 78, 79, 80 and 81 to the central portion of the sputter-etching chamber 54. Then the gate valve 77 is closed and the base plate 3 is caused to ascend by the elevator 82. Then the conveyor belts 78, 79, 80 and 81 are pivotally moved in the vertical direction, and the base plate 3 is caused to descend to position Q on the sputter-etching electrode 83 by means of the elevator 82. By impressing a voltage on the sputter-etching electrode 83, the base plate 3 can be subjected to sputter-etching. The base plate 3 thus treated is caused to ascend by the elevator 82 to position P in which it is close to the heater 85 which heats the base plate 3 to a temperature suitable for effecting sputtering. Meanwhile the conveyor belts 78, 79, 80 and 81 are returned to the horizontal position, and the elevator 82 is moved downwardly to deliver the heated base plate 3 to the conveyor belts 78, 79, 80 and 81, before being delivered to the sputtering chamber 55.

A gate valve 86 is mounted between the sputter-etching chamber 55 and the sputtering chamber 55 and has the same construction as the gate valve 64.

In the sputtering chamber 55, a first pair of conveyor belts 87 and 88, a first rise arm 89, a first sputtering electrode 90, a shield 91 for keeping sputtered particles from adhering to walls of the sputtering chamber 55, a first shutter 92, a second pair of conveyor belts 93 and 94, a second rise arm 95, a second sputtering electrode 96, a second shutter 97, a conveyor arm 99 movable between the first and second pairs of conveyor belts 87, 88 and 93, 94 along a ball screw 98, an exhaust port 100 communicating with a vacuum pump and a gas inlet means are mounted. The vacuum pump and the gas inlet means are not shown. The sputtering chamber 55 is in dynamic equilibrium at a constant pressure, such as $10^{-3}$ Torr, which may vary depending on the flow rate of sputtering gas, such as argon gas, introduced through the gas inlet means and the speed at which the chamber 55 is evacuated by the vacuum pump communicating with the exhaust port 100. The first and second conveyor belts 87, 88 and 93, 94 receive one base plate 3 after another from the conveyor belts 78, 79 and 80, 81 of the sputter-etching chamber 54 and convey same in the same direction to a position R close to the first rise arm 89. The first rise arm 89 receives in horizontal condition the base plate 3 conveyed to position R and, as shown in FIG. 4, pivotally moves through substantially 90° from a position S in a vertical direction, to bring the base plate 3 to an upright position in which it is juxtaposed against the first sputtering electrode 90. After the base plate 3 is subjected to sputtering, the rise arm 89 is restored to its position which is lower than the conveying surfaces of the first pair of conveyor belts 87 and 88. After the base plate 3 is brought to an upright position as aforesaid, the first shutter 92 is opened and the first sputtering electrode 90 performs a first sputtering treatment on the base plate 3, before the first shutter 92 is closed. The conveyor arm 99, which is connected to a drive source comprising the ball screw 98 trained over the first and second pairs of conveyor belts 87, 88 and 93, 94 and a motor, not shown, moves to a position T above the conveyor surfaces of the first pair of conveyor belts 87 and 88 while the base plate 3 is being subjected to the first sputtering treatment. In position T, the conveyor arm 99 receives from the first rise arm 89 the base plate 3 that has been subjected to the first sputtering treatment, and moves to a position U above the conveyor surfaces of the second pair of conveyor belts 93 and 94 where it transfers the base plate 3 to the second rise arm 95, before returning toward the first pair of conveyor belts 87 and 88. In position U, the second rise arm 95 receives the base plate 3 from the conveyor arm 99 and pivotally moves through substantially 90° to bring the base plate 3 to an upright position in which it is juxtaposed against the second sputtering electrode 96. After the base plate 3 is subjected to sputtering treatment, the second rise arm 95 pivotally moves back to the horizontal condition in which it is lower than the conveyor surfaces of the second pair of conveyor belts 93 and 94. After the base plate 3 is brought to the upright position as aforesaid, the second shutter 97 is opened to subject the base plate 3 to the second sputtering treatment by means of the second sputtering electrode 96, before the second shutter 97 is closed. The second pair of conveyor belts 93 and 94 receive the base plate 3 that has been subjected to the second sputtering treatment from the second rise arm 95 and conveys same toward the cooling chamber 56. The sputtering chamber 55 receives one base plate 3 from the conveyor belts 78, 79 and 80, 81 of the sputter-etching chamber 54 through the gate valve 86 which is placed on the first pair of conveyor belts 87 and 88. After the base plate 3 is delivered to the sputtering chamber 55, the gate valve 86 is closed, and the first pair of conveyor belts 87 and 88 convey the base plate 3 to position R, when the first rise arm 89 pivotally moves through substantially 90° to bring the base plate 3 to an upright position. When the base plate 3 is brought to the upright position, the first shutter 92 is opened to subject the base plate 3 to a first sputtering treatment. When the sputtering of the base plate 3 is finished, the first shutter 92 is closed and the first rise arm 89 moves pivotally toward a horizontal position to place the base plate 3 that has been subjected to the first sputtering treatment on the conveyor arm 99 standing by in position T, from which the conveyor arm 99 moves to a position U above the second pair of conveyor belts 93 and 94, while the second rise arm 95 standing by below position U pivotally moves to bring the base plate 3 to an upright position. At this time, the second shutter 97 is opened and the second sputtering electrode 96 performs a second sputtering treatment on the base plate 3 while the conveyor arm 99 moves from position U toward the first pair of conveyor belts 87 and 88. The second shutter 97 is closed and the second rise arm 95 pivotally moves in a horizontal direction, to transfer the base plate 3 that has been subjected to the second sputtering treatment to the second pair of conveyor belts 93 and 94, to convey same to the cooling chamber 56.

A gate valve 101 is mounted between the sputtering chamber 55 and the cooling chamber 56 and has the same construction as the gate valve 64 referred to hereinabove.

The cooling chamber 56 which is adjacent to and partitioned off the sputter-etching chamber 54 by a partition wall 102 has mounted therein a pair of conveyor belts 103 and 104, an exhaust port 105 communicating with a vacuum pump and a gas inlet means. The vacuum pump and the gas inlet means are not shown. The exhaust port 105 is constructed such that it cooperates with the exhaust port 84 of the sputter-etching chamber 54 to define a circle, and the cooling chamber 56 shares the vacuum pump with the sputter-etching chamber 54 so as to be kept at the same pressure as the sputter-etching chamber 54. In the cooling chamber, the base plate 3 is supplied from the sputtering chamber 55 via the gate valve 101 and placed on the conveyor belts 103 and 104 in which the base plate 3 is subjected to radiation cooling, before a base plate 3' now a completed article is delivered to the second intermediate chamber 57.

A gate valve 106 of the same construction as the gate valve 64 is mounted between the cooling chamber 56 and the second intermediate chamber 57.

The second intermediate chamber 57 which is adjacent to and partitioned off the first intermediate chamber 53 by a partition wall 107 has mounted therein a pair of conveyor belts 108 and 109, a cassette elevator 110 having a base plate cassette 111, an exhaust port 112 and a gas inlet means. The gas inlet means is not shown. The cassette elevator 110 and the base plate cassette 111 are of the same construction as the cassette elevator 62 and the base plate cassette 63 respectively of the first outside storing means 50. The exhaust port 112 is constructed such that it cooperates with the exhaust port 76 of the first intermediate chamber 53 to define a circle and communicates with the same vacuum pump as the exhaust port 76. The vacuum pump is not shown. The second intermediate chamber 57 receives the base plate 3' which is a completed article one by one from the conveyor belts 103 and 104 of the cooling chamber 56 through the gate valve 106, and the base plate 3' is placed in the base plate cassette 111 by means of the cassette elevator 110. When a predetermined number of base plates 3' are placed in the base plate cassette 111, the gate valve 106 is closed and the pressure in the second intermediate chamber 57 is rendered substantially equal to the pressure prevailing in the withdrawing chamber 58 by adjusting the flow rate of the gas introduced by the means for introducing gas, such as nitrogen gas, and the velocity at which the chamber 57 is evacuated by the vacuum pump through the exhaust port 112. Then one base plate 3' after another is fed from the base plate cassette 111 to the withdrawing chamber 58 by the conveyor belts 108 and 109 cooperating with the cassette elevator 110.

A gate valve 113 of the same construction as the gate valve 64 is mounted between the second intermediate chamber 57 and the withdrawing chamber 58.

The withdrawing chamber 58 is adjacent to and partitioned off the inlet chamber 52 by a partition wall 114, and has mounted therein a pair of conveyor belts 115 and 116, a cassette elevator 117 having a base plate cassette 118, an exhaust port 110 and means for leaking air to the atmosphere. The air leaking means is not shown. The cassette elevator 117 and the base plate cassette 118 are of the same construction as the cassette elevator 62 and the base plate cassette 63 respectively of the first outside storing means 50. The exhaust port 119 is constructed such that it cooperates with the exhaust port 69 of the inlet chamber 52 to define a circle and communicates with the same vacuum pump 70 as the exhaust port 69. In the withdrawing chamber 58, one base plate 3' after another is received from the conveyor belts 108 and 109 of the second intermediate chamber 57 through the gate valve 113 and placed on the conveyor belts 115 and 116, and the base plates 3' are placed in the base plate cassette 118 through the operation of the cassette elevator 117. After a predetermined number of base plates 3' are placed in the base plate cassette 118, the gate valve 113 is closed and the exhaust port 119 is closed by means of a valve, not shown, and air is introduced into the chamber 58 through the air leaking means, to render the pressure in the chamber 58 atmospheric. Then one base plate 3' after another is delivered from the base plate cassette 118 by the conveyor belts 115 and 116 cooperating with the cassette elevator 117.

A gate valve 120 of the same construction as the gate valve 64 is mounted between the withdrawing chamber 58 and the second outside storing means 59 or on a side wall on the outlet side of the withdrawing chamber 58.

A portion of each of the chambers 52–58 at which the moving member is introduced from the atmospheric side to the chamber side is provided with an airtight seal in the form of a vacuum bellows or an O-ring.

The second outside storing means 59 comprises a pair of conveyor belts 121 and 122, and a cassette elevator 123 having a base plate cassette 124. The cassette elevator 123 and the base plate cassette 124 are of the same construction as the cassette elevator 62 and the base plate cassette 63 respectively of the first outside storing means 50. The second outside storing means 59 receives one base plate 3' after another from the conveyor belts 115 and 116 of the withdrawing chamber 58 through the gate valve 120, and the conveyor belts 121 and 122 convey same to a predetermined position for the cassette elevator 123 where the base plate 3' is placed by the cassette elevator 123 in the base plate cassette 124. After a predetermined number of base plates 3' are temporarily placed in the base plate cassette 124, the gate valve 120 is closed.

The sputtering apparatus of the aforesaid construction operates as follows. The base plate 3 to be treated is freely placed on the conveyor belts 60 and 61 of the first outside storing means 50 and conveyed to a position in which the cassette elevator 62 is located, so that one base plate 3 after another is placed in the base plate cassette 63 on one of the shelves therein. Each time one base plate 3 is placed on one shelf, the cassette elevator 62 moves upwardly a distance corresponding to the pitch of the shelves, to enable the base plate 3 conveyed thereto thereafter to be accommodated. This operation is repeatedly carried out, so as to temporarily store in the base plate cassette 63 a predetermined number of base plates 3 that are conveyed to the means 50 at irregular intervals in time. When the number of base plates 3 stored in the base plate cassette 63 reaches the predetermined number, the gate valve 64 on the inlet side of the inlet chamber 52 is opened, and the cassette elevator 62 of the first outside storing means 50 moves downwardly a distance corresponding to one pitch of the shelves to deliver one base plate 3 after another to the inlet chamber 52 by the conveyor belts 60 and 61 of the first outside storing means 50 and the belt conveyors 65 and 66 of the inlet chamber 52.

The base plates 3 delivered continuously to the inlet chamber 52 are placed one after another in the base plate cassette 68 by the cassette elevator 67, and the gate valve 64 is closed when the base plates 3 in the base plate cassette 63 of the first outside storing means 50 are all placed in the base plate cassette 68 in the inlet chamber 52. Then the inlet chamber 52 is evacuated by the vacuum pump 70 through the exhaust port 69. At this time, the withdrawing chamber 58 is also evacuated. While the inlet chamber 52 is being evacuated, the base plates 3 are subjected to baking by means of the heater to degass them, thereby completing the operation of introducing the base plates 3 into the sputtering apparatus.

By adjusting the flow rate of the gas introduced into the chamber 52 through the gas inlet means and the rate at which the chamber 52 is evacuated through the exhaust port 76 by the vacuum pump, the pressure in the first intermediate chamber 53 is rendered substantially equal to that of the inlet chamber 52. Then the gate valve 71 between the inlet chamber 52 and the first intermediate chamber 53 is opened, and the cassette elevator 74 in the inlet chamber 52 is moved downwardly a distance corresponding to one pitch of the shelves of the cassette 75, to convey one base plate 3 after another by the conveyor belts 65 and 66 of the inlet chamber 52 and the conveyor belts 72 and 73 of the first intermediate chamber 53 to the first intermediate chamber 53. In the first intermediate chamber 53, one base plate 3 after another is placed by the cassette elevator 74 in the base plate cassette 75, and the gate valve 71 is closed when all the base plates 3 in the base plate cassette 68 of the inlet chamber 52 are placed in the base plate cassette 75 of the first intermediate chamber 53. After the gate valve 71 is closed, an operation for introducing the base plates 3 into the inlet chamber 52 is initiated again.

The flow rate of the gas, such as $N_2$ gas, introduced through the gas inlet means into the first intermediate chamber 53 and the speed at which the chamber 53 is evacuated by the vacuum pump communicated with the exhaust port 76 are adjusted, to render the pressure in the first intermediate chamber 53 substantially equal to that in the sputter-etching chamber 54. Following this adjustment of the pressure, the gate valve 77 between the first intermediate chamber 53 and the sputter-etching chamber 54 is opened and the cassette elevator 74 in the first intermediate chamber 53 is moved downwardly a distance corresponding to one pitch of the shelves, to deliver one base plate 3 after another to the central portion of the sputter-etching chamber 54 by the conveyor belts 72 and 73 in the first intermediate chamber 53 and the conveyor belts 78, 79, 80 and 81 in the sputter-etching chamber 54. The gate valve 77 is closed each time one base plate 3 is conveyed.

Upon the base plate 3 being conveyed to the central portion of the sputter-etching chamber 54, the elevator 82 is actuated to raise the base plate 3 temporarily to a position higher than the conveyor surfaces of the conveyor belts 78, 79, 80 and 81. Then the conveyor belts 78, 79, 80 and 81 are pivotally moved in the vertical direction, and the elevator 82 is moved downwardly to move the base plate 3 to position Q above the sputter-etching electrode 83. Thereafter a voltage is impressed on the sputter-etching electrode 83 to subject the base plate 3 to sputter-etching treatment for removing from the base plate 3 foreign matters, such as an oxide film, that might be deposited thereon (this operation is necessary when aluminum sputtering is performed on a bipolar IC). Following this sputter-etching operation, elevator 82 moves upwardly again to position P in which the base plate 3 is close to the heater 85, and the heater 85 is actuated to heat the base plate 3 to a temperature suitable for sputtering. Meanwhile the conveyor belts 78, 79, 80 and 81 are pivotally moved in a horizontal direction. Following heating of the base plate 3 by the heater 85, the elevator 82 moves downwardly again to place the base plate 3 on the conveyor belts 78, 79, 80 and 81. At this time, the gate valve 86 between the sputter-etching chamber 54 and the sputtering chamber 55 is opened, and the base plate 3 is conveyed by the conveyor belts 78, 79, 80 and 81 of the sputter-etching chamber 54 and the first pair of conveyor belts 87 and 88 of the sputtering chamber 55 to position R in the sputtering chamber 55, before the gate valve 86 is closed. Then the gate valve 77 between the first intermediate chamber 53 and the sputter-etching chamber 54 is opened, to be ready for introduction of the next following base plate 3 into the sputter-etching chamber 54.

At the time the base plate 3 is conveyed to position R in the sputtering chamber 55, the first rise arm 89 is pivotally moved from a horizontal position S in a vertical direction to bring the base plate 3 to an upright position in which it is juxtaposed against the first sputtering electrode 90. A voltage is impressed on the first sputtering electrode 90 to cause ionized argon gas to impinge on the sputtering electrode 90 to release the atomic particles of the film forming material. The first shutter 92 is opened and the base plate 3 is subjected to the first sputtering treatment. The first shutter 92 is closed when the first sputtering treatment is finished. Then the first rise arm 89 pivotally moves from the vertical position to the horizontal position to place the base plate 3 on the conveyor arm 99 in position T on the first pair of conveyor belts 87 and 88, and the conveyor arm 99 moves to a position U above the second pair of conveyor belts 93 and 94. Upon the base plate 3 being moved to position U, the second rise arm 95 pivotally moves from a horizontal position to a vertical position to bring the base plate 3 to an upright position in which it is juxtaposed against the second sputtering electrode 96. A voltage is impressed on the second sputtering electrode 96 to cause ionized argon gas to impinge on the sputtering electrode 96 to release the atomic particles of the film forming material. The second shutter 95 is opened and the base plate 3 is subjected to a second sputtering treatment and the second shutter 95 is closed when the second sputtering treatment is finished. The reason why two sputtering treatments are given is because it is necessary to continue operation without increasing the tact time even when the film to be formed needs to have a large thickness. During the second sputtering treatment, the conveyor arm 99 is moved to a position in which it is away from the second pair of conveyor belts 93 and 94. Upon completion of the second sputtering treatment, the second rise arm 95 moves pivotally in a horizontal direction to place the base plate 3 on the second pair of conveyor belts 93 and 94. Then the gate valve 101 between the sputtering chamber 55 and the cooling chamber 56 is opened, and the base plate 3 is conveyed by the second pair of conveyor belts 93 and 94 of the sputtering chamber 55 and the pair of conveyor belts 103 and 104 of the cooling chamber 56 to the cooling chamber 56. Thereafter the gate valve 101 between the sputtering chamber 55 and the cooling chamber 56 is closed, and the gate valve 86 between the sputtering chamber 55 and the sputter-etching chamber 54 is opened.

The base plate 3 conveyed to the cooling chamber 56 is subjected to radiation cooling on the belt conveyors 103 and 104. After the base plate 3 is cooled, the gate valve 106 between the cooling chamber 56 and the second intermediate chamber 57 is opened, so that a base plate 3' which is a completed article is conveyed by the pair of conveyor belts 103 and 104 of the cooling chamber 56 and the pair of conveyor belts 108 and 109 in the second intermediate chamber 57 to the second intermediate chamber 57.

The base plates 3 are treated one by one in the sputter-etching chamber 54, sputtering chamber 55 and cooling chamber 56.

The base plate 3' conveyed to the second intermediate chamber 57 is conveyed by the conveyor belts 108 and 109 to the position in which the cassette elevator 110 is located, and the cassette elevator 110 is moved upwardly for a distance corresponding one pitch of the shelves to place each base plate 3 on one of the shelves of the base plate cassette 111, so that base plates 3 are housed in the base plate cassette 111. When a predetermined number of base plates 3' are housed in the base plate cassette 111, the gate valve 106 between the cooling chamber 56 and the second intermediate chamber 57 is closed, and the flow rate of the gas introduced through the gas inlet means and the speed at which the chamber 57 is evacuated through the exhaust port 112 communicating with the vacuum pump are adjusted, to render the pressure in the second intermediate chamber 57 substantially equal to that in the withdrawing chamber 58. After the pressure is adjusted, the gate valve 113 between the second intermediate chamber 57 and the withdrawing chamber 58 is opened.

After the gate valve 113 is opened, the cassette elevator 110 in the second intermediate chamber 57 is moved downwardly a distance corresponding to one pitch of the shelves, to deliver one base plate 3' after another from the base plate cassette 111. The base plate 3' is conveyed by the conveyor belts 108 and 109 in the second intermediate chamber 57 and the conveyor belts 115 and 116 in the withdrawing chamber 58 to the position in which the cassette elevator 117 in the withdrawing chamber 58 is located, and the cassette elevator 110 is moved upwardly a distance corresponding one pitch of the shelves to place each base plate 3' on one of the shelves in the base plate cassette 111. When all the base plates 3' are placed in the base plate cassette 118 in the withdrawing chamber 58, the gate valve 113 between the second intermediate chamber 57 and the withdrawing chamber 58 is closed, and the exhaust port 119 is closed by a valve, not shown, to allow air to be introduced from the atmosphere through the leak means, to render the pressure in the withdrawing chamber 58 atmospheric, before the gate valve 120 between the withdrawing chamber 58 and the second outside storing means 59 is opened.

After the gate valve 113 is opened, the cassette elevator 110 in the second intermediate chamber 57 moves downwardly a distance corresponding to one pitch of the shelves to deliver one base plate 3' after another from the base plate cassette 111. The base plate 3' is conveyed by the conveyor belts 108 and 109 in the second intermediate chamber 57 and the conveyor belts 115 and 116 in the withdrawing chamber 58 to the position in which the cassette elevator 117 is located in the withdrawing chamber 58, and the cassette elevator 117 moves upwardly a distance corresponding to one pitch of the shelves to place each base plate 3' on one of the shelves in the base plate cassette 118. When all the base plates 3' in the base plate cassette 111 in the second intermediate chamber 57 are placed in the base plate cassette 118 in the withdrawing chamber 58, the gate valve 113 between the second intermediate chamber 57 and the withdrawing chamber 58 is closed and the exhaust port 119 is closed by a valve, not shown, so that air is introduced into the withdrawing chamber 58 from the atmosphere through the air leak means to render the pressure in the withdrawing chamber 58 atmospheric before the gate valve 120 between the withdrawing chamber 58 and the second outside storing means 59 is opened.

One base plate 3' after another is withdrawn from the base plate cassette 118 by the conveyor belts 115 and 116 in the withdrawing chamber 58 cooperating with the cassette elevator 117, and transferred to the conveyor belts 121 and 122 of the second outside storing means 59. The base plate 3' is conveyed to the position in which the cassette elevator 123 is located, and the cassette elevator 123 moves a distance corresponding one pitch of the shelves to store the base plate 3' temporarily in the base plate cassette 124. When all the base plates 3' in the base plate cassette 118 in the withdrawing chamber 58 are placed in the base plate cassette 124 of the second outside storing means 59, the gate valve 120 is closed.

When necessary, the second outside storing means 59 may be actuated to move the cassette elevator 123 thereof downwardly a distance corresponding to one pitch of the shelves, to withdraw one base plate 3' after another from the base plate cassette 124 before the base plates 3' are delivered to the next operation step by the conveyor belts 121 and 122.

The series of operations set forth hereinabove are repeatedly performed to subject the base plates to sputtering treatment continuously without any interruption.

In the aforesaid construction, when enough cooling of the base plates 3 is not unobtainable merely by radiation cooling, cooling means relying on heat transfer, such as by bringing a water cooling rod into direct contact with each base plate, may be additionally used.

In the embodiment shown and described, the sputtering chamber is constituted by the sputter-etching chamber 54, sputtering chamber 55 and cooling chamber 56. Depending on the use to which the apparatus is put, either one or both of the sputter-etching chamber 54 and cooling chamber 56 may be dispensed with. More specifically, when a certain type of semiconductor element is produced, it is not necessary to remove a film of an oxide, such as $SiO_2$, from the surface of the wafers by sputter-etching. In this case, the sputter-etching chamber 54 may be dispensed with. However, it has been ascertained that baking should be performed for each base plate so that the base plate is advantageously be subjected to baking one by one by heating same with a heater without subjecting same to sputter-etching in the sputter-etching chamber 54.

In the embodiment shown and described, there is provided conveyor means comprising a pair of conveyor belts for conveying the base plate substantially in a horizontal position, there is provided a base plate storing means comprising a cassette elevator and a base plate cassette, and there is provided an opening means in the form of a gate valve adapted to open only when the base plate travels between the chambers. It is to be understood, however, that the invention is not limited to the specific forms of the conveyor means, base plate storing means and opening means, and that any other suitable form may be used as desired.

According to the invention, a sputter-etching electrode, a heater, a sputtering electrode, a shutter and a cooling means constitute sputtering means, and an exhaust port and a vacuum pump constitute evacuating means.

The apparatus according to the invention has the aforesaid construction and operates as described hereinabove. According to the invention, all the chambers are separate from and independent of one another to ensure that each treatment assigned to each chamber is positively performed. By virtue of this feature, a film of high quality can be formed on each base plate in a stable manner with high productivity on a continuous mass-production basis.

According to the invention, the conveyor means is operative to support a base plate in a substantially horizontal position. This enables transfer of the base plate from one chamber to the next with a higher reliability than would be the case if the base plate were conveyed in a vertical or tilting position.

Figure 6:
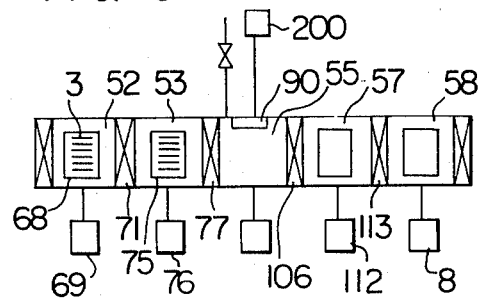
FIG. 6 is a schematic view of the embodiment of the invention shown in FIG. 3.

FIG. 6 shows in a schematic view the embodiment of the apparatus in conformity with the invention described hereinabove. As shown, the first intermediate chamber 53 and the second intermediate chamber 57 are interposed between the inlet chamber 52 and the sputtering chamber 55 and between the sputtering chamber 55 and the withdrawing chamber 58 respectively. The two chambers 53 and 57 are evacuated through the exhaust ports 76 and 112 respectively to a predetermined pressure level.

A plurality of untreated base plates 3 are placed in the inlet chamber 52 in atmospheric condition which is evacuated by the exhaust pump 76 to a predetermined pressure level.

At this time, the withdrawing chamber 58 which is vacent after the treated base plates 3 have been withdrawn therefrom is also evacuated by the exhaust pump 112 to a predetermined pressure level.

After the inlet chamber 52 is evacuated to the predetermined pressure level, the gate valve 71 mounted between the inlet chamber 52 and first intermediate chamber 53 is opened and the base placed 3 placed in the inlet chamber 52 are all transferred to the first intermediate chamber 53. After the transfer of the base plates 3 is finished, the gate valve 71 is closed and the inlet chamber 52 is restored to an atmospheric pressure level to allow untreated base plates to be placed therein for the next performance.

While the inlet chamber 52 is being evacuated again by the exhaust pump 79, the plurality of base plates 3 stored in the first intermediate chamber 53 are successively fed one by one to the sputtering chamber 55 by conveyor means, not shown, to form a film of the desired thickness thereon before being stored in the second intermediate chamber 57. When all the base plates stored in the first intermediate chamber 53 are all subjected to sputtering treatment and then stored in the second intermediate chamber 57, the gate valves 77 and 106 mounted on opposite ends of the sputtering chamber are closed. Thereafter the gate valve 113 mounted between the second intermediate chamber 57 and withdrawing chamber 58 is opened to transfer to the withdrawing chamber 58 the treated base plates 3 stored in the second intermediate chamber 57.

At this time, the gate valve 71 is opened to transfer the plurality of base plates 3 stored in the inlet chamber 52 of a predetermined pressure level to the first intermediate chamber 53. 200 designates a power source for supplying a sputtering voltage to the sputtering electrode 90.

By continuously repeating the aforesaid operations, the following effects can be achieved.

(1) The arrangement whereby the base plates 3 fed from the first intermediate chamber 53 to the sputtering chamber 55 can be subjected to sputtering treatment while the inlet chamber 52 and withdrawing chamber 58 are being evacuated eliminates wasting of time, thereby increasing productivity.

(2) The inlet chamber 52 and withdrawing chamber 58 that are repeatedly have their pressures changed from atmospheric to vacuum are indirectly in communication with each other through the intermediate chambers 53 and 57, and the gate valves 71 and 77 and 106 and 113 do not open at the same time. This is conductive to prevention of contamination of the atmosphere of the sputtering chamber with the components of the atmosphere, thereby improving the quality of the film formed on each base plate.

Another embodiment of the sputtering apparatus in conformity with the invention will now be described by referring to FIGS. 7 and 8. A reserve vacuum chamber 152, a pretreating chamber 153 and a sputtering chamber 154 are defined in a sealed casing 151. The pretreating chamber 153 and sputtering chamber 154 will generally be referred to as a sputter treatment chamber 155.

Gate valves 156 and 157 are mounted between the reserve vacuum chamber 152 and pretreating chamber 153 and between the pretreating chamber 153 and sputtering chamber 154 respectively. The gate valves 156 and 157 are each provided with an air cylinder, not shown, so that they are opened when the base material 3 to be treated, such as a wafer, is transferred between the respective chambers.

The reserve vacuum chamber 152 has connected thereto a vacuum pump 159 via a main valve 158, a rough drawing line 160, an atmosphere leak line 161 and a lid 163 opened and closed for moving a cassette 162 into and out of the chamber 152, and two sets of cassette elevators 164 and 165 and a base plate conveyor belt 166 are mounted in the chamber 152. The main valve 158 is opened and closed by an air cylinder, not shown. The cassette elevators 164 and 165 are moved up and down by the combination of motors 167 and 168, screws 169 and 170 and nuts 171 and 172. The cassettes 162 and 173 are formed such that they are placed on the cassette elevators 164 and 165 respectively and include shelves arranged to support the base plates 3 thereon. The base plate conveyor belt 166 is driven by a motor 174 for conveying the base plates between the two cassettes 162 and 173 and between the reserve vacuum chamber 152 and pretreating chamber 153.

The pretreating chamber 153 is connected to a vacuum pump 176 via a main valve 175, and has an argon gas line 177 connected thereto. A sputter-etching electrode 178, a base plate conveyor arm 179, two sets of base plate conveyor belts 180 and 181 and a heater 182 is mounted in the chamber 153. The base plate conveyor arm 179 has two fingers 183 and 184 and is capable of vertical movement and rotary movement by means of an air cylinder and a motor, not shown. The two sets of base plate conveyor belts 180 and 181 are driven by motors 185 and 186 respectively, and as shown in FIG. 3, the base plate conveyor belts 180 and 181 are pivotable as a whole by means of another motor, not shown. The heater 182 is in a position C as shown in FIG. 7.

The pressure in the pretreating chamber 153 is kept at a level, such as $10^{-3}$ Torr, which is suitable for performing sputter-etching during operation at all times by adjusting the flow rate of the argon gas introduced through the argon gas line 177 and the speed at which the chamber 153 is evacuated by the vacuum pump 176.

The sputtering chamber 154 is connected to a vacuum pump 188 via a main valve 187, and has an argon gas line 189 connected thereto. A sputtering electrode 190, base plate conveyor belts 87 and 88, a rise mechanism 89, a shutter 92 and an adhesion shield 91 are mounted in the chamber 154. The base plate conveyor belts 87 and 88 are driven by a motor 195 for conveying the base plate between the gate valve 157 and rise mechanism 89 which is driven by a motor 196 for bringing the base plate 3 into an upright position in which it is juxtaposed against the sputtering electrode 90, after the base plate 3 is delivered by the base plate conveyor belts 87 and 88. The sputter 92 is driven by a motor, not shown, and the adhesion shield 91 performs the function of reducing the amount of the sputtering material that might adhere to the inner surfaces of the chamber 154 after its atomic particles are released.

The pressure in the sputtering chamber 154 is kept at a level which is suitable for performing sputtering treatment during operation at all times by adjusting the flow rate of the argon gas introduced through the argon gas line 189 and the speed at which the chamber 154 is evacuated by the vacuum pump 188, so that it is possible to minimize the influences exerted by the sputtering chamber 154 by impure gases that might be produced. The arrangement whereby the means for bringing the base plate to a substantially upright position in which it is juxtaposed against the sputter treatment means in the sputtering chamber 154 enables the amount of foreign matter that might be deposited on the base plate to be minimized.

In operation, the lid 163 of the reserve vacuum chamber 152 is removed and the cassette 162 stroting the base plates 3 to be treated is placed on the cassette elevator 164. After the lid 165 is placed in position again, rough evacuation of the chamber 152 is effected by means of a rough evacuating pump, not shown, through the rough evacuating line 160. Then the main valve 158 is opened to evacuate the reserve vacuum chamber 152 by means of the vacuum pump 159 to create a vacuum of about $10^{-5}$ Torr, for example. Thereafter the cassette elevator 164 is moved downwardly by the motor 167, screw 169 and nut 171 cooperating with one another until the lowermost base plate 3 in the cassette 164 is brought into contact with the base plate conveyor belt 166, which is driven by the motor 167 to convey the base plate 3 to the position of the cassette 173 to place it on one of the shelves in the cassette 173. The cassette elevator 165 is moved upwardly by the motor 168, screw 170 and nut 172 cooperating with one another a distance corresponding to the pitch of the shelves, to be ready for receiving the next following base plate 3. By repeating the process described hereinabove, all the base plates 3 in the cassette 162 are transferred to the cassette 173. Then the gate valve 156 is opened and the cassette elevator 165 is moved downwardly a distance corresponding to the pitch of the shelves, to deliver the base plate 3 to the pretreating chamber 153 by the base plate conveyor belt 166. Thus the delivery of the base plates 3 to be treated to the pretreating chamber 153 and receiving of the treated base plates 3 from the pretreating chamber 153 can be effected by using the single reserve vacuum chamber 152, thereby enabling the construction of the apparatus to be greatly simplified.

Figure 7:
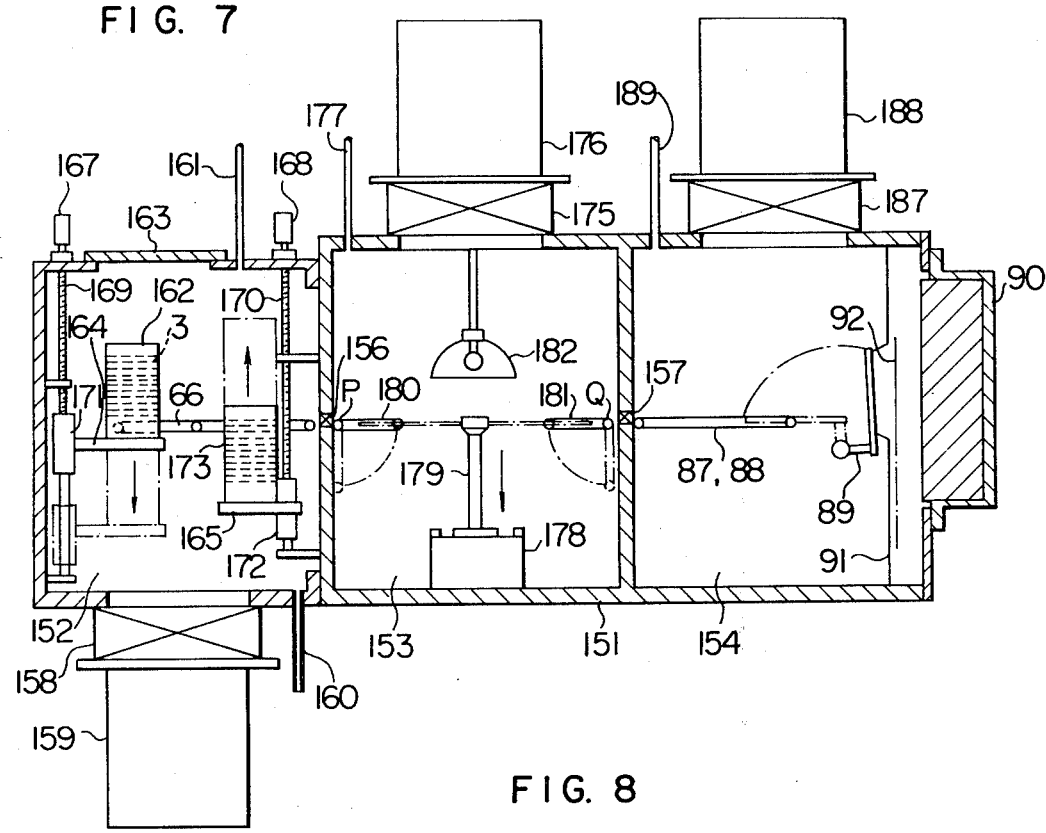
FIG. 7 is a vertical sectional view of the sputtering apparatus according to another embodiment of the invention.
Figure 8:
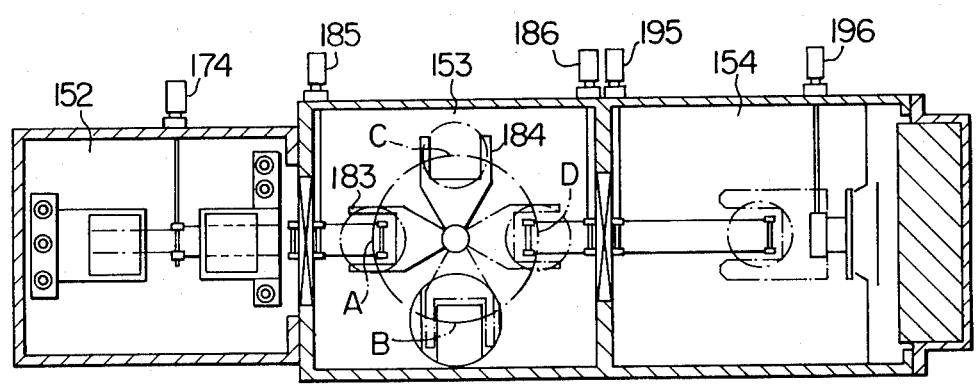
FIG. 8 is a transverse sectional plan view of the embodiment of the invention shown in FIG. 7.

As shown in FIGS. 7 and 8, when the base plate 3 is delivered from the reserve vacuum chamber 152 to the pretreating chamber 153, the base plate conveyor arm 179 is disposed in an upper position, the finger 183 is in a position A, the finger 184 is in a position B, and the base plate conveyor belts 180 and 181 are in horizontal position.

The base plate 3 delivered through the gate valve 156 is conveyed by the base plate conveyor belt 180 driven by the motor 185 to the finger 183 in position A. After the gate valve 156 is closed, a motor, not shown, is actuated to cause the base plate conveyor belts 180 and 181 to move in pivotal movement about points P and Q respectively, to place the base plate 3 on the finger 183. Then the base plate conveyor arm 179 descends after rotating until the finger 183 comes to a position B, to place the base plate 3 on the sputter-etching electrode 178. A sputter-etching voltage is impressed on the sputter-etching electrode 178 to subject the base plate 3 to sputter-etching treatment for removing an oxide film that is formed on the base plate 3. This permits an electric current to be passed in good condition between the base plate 3 and a thin film formed thereon by sputtering (an aluminum coat deposited by vaporization in vacuum). Then the base plate arm 179 is moved upwardly and rotated until the finger 183 reaches position C, and the heater 182 is actuated to heat the base plate 3. Then the base plate conveyor arm 179 is rotated until the finger 183 reaches position D, and the base plate conveyor belts 180 and 181 are pivotally moved by motors, not shown, until they assume a horizontal position. The result of this is that the base plate 3 on the finger 183 is placed on the base plate conveyor belt 181. After the gate valve 157 is opened, the motor 186 is actuated to deliver the base plate 3 to the sputtering chamber 154. After the base plate 3 is delivered to the sputtering chamber 154, the gate valve 157 is closed and the next following base plate 3 is received from the reserve vacuum chamber 152, to repeat the aforesaid process of sputter-etching treatment and heating treatment described hereinabove. Then the base plate 3 on the finger 183 stands by in position B, the finger 184 stands by in position D and the base plate conveyor belts 180 and 181 stand by in their horizontal position.

In the sputtering chamber 154, the base plate delivered through the gate valve 157 is conveyed, by the base plate conveyor belts 87 and 88 driven by the motor 195, to the rise mechanism 89 in a horizontal position. Then the rise mechanism is driven by the motor 196 to pivotally move until the base plate 3 is brought to a substantially upright position, and the shutter 92 is opened by a motor, not shown, to allow a thin film to be coated on the base plate 3 by sputtering treatment effected by the sputtering electrode 90 having a sputtering voltage impressed thereon. The sputtering material may be aluminum. After the base plate 3 is subjected to sputtering treatment for a predetermined period of time, the rise mechanism 89 is restored to its horizontal position and the base plate 3 is delivered to the finger 184 of the pretreating chamber 155 by means of the base plate conveyor belts 87 and 88 passing through the gate valve 157. The base plate conveyor belts 180 and 181 are pivotally moved to an upright position and the base plate conveyor arm 179 is rotated to place the base plate 3 to be treated on the finger 183 in position D and to place the base plate 3 that has been treated in position C. Thereafter the base plate 3 to be treated is delivered to the sputtering chamber 154 in the same manner as described hereinabove to subject same to sputtering treatment, while the base plate 3 in position C that has been treated is brought to position A by rotating the base plate conveyor arm 179, before being delivered to the reserve vacuum chamber 152 by reversing the process followed before as described above. In the reverse vacuum chamber 152, the base plate 3 that has been subjected to sputtering treatment passes through the cassette 173 before being stored in the cassette 162, and the next following base plate 3 is delivered from the cassette 173 to the pretreating chamber 153.

The aforesaid series of operations are repeated to subject all the base plates stored in the cassette 173 of the reserve vacuum chamber 152 to sputtering treatment and stored the treated base plate in the cassette 162. Then leak gas is introduced into the reserve vacuum chamber 152 through the leak line 161 to render the pressure therein atmospheric, and thereafter the lid 163 is removed to withdraw the cassette 162 from the chamber 152, thereby completing a series of sputtering operations.

To subject the base plate both to baking treatment and sputter-etching treatment before it is subjected to sputtering treatment requires the provision of the pretreating chamber 163. More specifically, it is impossible to form a thin film by sputtering on the base plates if the base plates 3 are stored in bulk in the reverse vacuum chamber 142 to be subjected to baking therein. It is necessary to subject one base plate after another to baking treatment by using a heater in the pretreating chamber that is provided specially in this embodiment.

When the reserve vacuum chamber 152 is disposed adjacent the pretreating chamber 143, impure gases in the reverse vacuum chamber 152 might be introduced into the sputtering chamber 154 through the pretreating chamber 153 each time the gate valve 157 is opened. When this is the case, the film formed on the base plate might have its quality reduced and it would be impossible to indert or withdraw the cassette and base plates into and out of the reserve vacuum chamber 152 unless all the base plates that have been subjected to sputtering treatment are stored in the reserve vacuum chamber 152, so that the apparatus would have a low throughput. This problem can be obviated by providing between the reserve vacuum chamber 152 and the pretreating chamber 153 an intermediate chamber in which a cassette having a large number of base plates stored therein can be placed.

In the embodiment shown and described hereinabove, no conveyor jigs are used and the base plates are conveyed by themselves. Thus the amount of impure gases introduced into the sputtering chamber can be greatly reduced by not using conveyor jigs. At the same time, deterioration in the quality of the film formed on each base plate due to the impure gases can be avoided, and heating and cooling can be performed in a short period of time because the thermal capacity of wafers is low.

In the embodiment shown and described hereinabove, there is provided rise means in the sputtering treatment chamber which is operative to bring each base plate to an upright position in which it is juxtaposed against the sputter treating means. This is conductive to prevention of the deposition of foreign matter on the base plate which might otherwise occur due to sudden bursting of the sputtering electrode or fall of flakes. Moreover, it is possible to keep the base plate and the sputtering electrode stationary in juxtaposed relation while a sputtering operation is being performed, thereby increasing the speed at which films are formed on the base plates.

Figure 9:
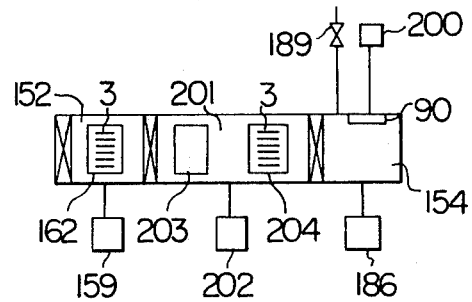
FIG. 9 is a schematic view of the embodiment of the invention shown in FIG. 7.

FIG. 9 is a schematic view of the embodiment shown and described hereinabove. In this case, the reserve vacuum chamber 152 serves both as the inlet chamber 52 and the withdrawing chamber 58 shown in FIG. 6. Means is provided in the chamber 152 for introducing the base plates thereinto and withdrawing same therefrom when the atmospheric pressure prevails therein and for evacuating the chamber 152 to a predetermined pressure level by the vacuum pump 159. An intermediate chamber 201 is evacuated by a vacuum pump 202 at all times to create a vacuum therein and provided with means for successively delivering base plates 3 to be treated to the sputtering chamber 154, and means for receiving and storing the treated base plates 3 from the sputtering chamber 154. Like the embodiment shown in FIG. 6, the embodiment shown in FIG. 9 enables the base plates 3 stored in the intermediate chamber 201 to be successively delivered to the sputtering chamber 154 while the reserve vacuum chamber storing therein a large number of base plates 3 to be treated in the next following operation is being evacuated by the vacuum pump 202, at the same time as the operation of storing again the base plates 3 that have been subjected to sputtering is performed. This is conductive to increased productivity. In this case, it is necessary that the intermediate chamber 201 deliver the treated base plates to the reserve vacuum chamber 152 after receiving the base plates to be treated from the reserve vacuum chamber 152. Thus to meet this requirement, the reserve vacuum chamber 152 is designed to have a capacity large enough to treat twice the predetermined number of base plates to be treated.

From the foregoing description, it will be appreciated that the present invention can have application not only in sputtering apparatus but also in other similar apparatus, such as an apparatus for continuous deposition of metal in vacuum, that requires similar treatment to be given in vacuum.

The invention can achieve the effects of saving the wasted time and increasing the productivity of the operation in vacuum as compared with apparatus of the prior art while improving the quality of the film formed on the object by avoiding contamination of the atmosphere in the sputtering chamber.

What is claimed is:
1. An apparatus for performing continuous treatment in vacuum, comprising:
   (a) an inlet chamber having atmospheric leak means connected thereto and including therein a cassette elevator for moving upwardly and downwardly a cassette in which a number of shelves are arranged in a vertically spaced relation to receive a number of articles with predetermined spacing intervals defined thereamong, said inlet chamber being adapted to subject, collectively, the number of articles received in said cassette to evacuation treatment;
   (b) a first intermediate chamber including therein a cassette elevator for moving upwardly and downwardly a cassette in which a number of shelves are arranged in a vertically shaped relation to receive the articles with predetermined spacing intervals defined thereamong, said first intermediate chamber being adapted to receive therein the number of articles in a manner that the articles are received in the cassette located therein;
   (c) a vacuum treating chamber having at least one vacuum treating means mounted therein;
   (d) a second intermediate chamber including therein a cassette elevator for moving upwardly and downwardly a cassette in which a number of shelves are arranged in a vertically spaced relation to receive the articles with predetermined spacing intervals defined thereamong, said second intermediate chamber being adapted to receive therein the number of articles in a manner that the articles are received in the cassette located therein;
   (e) a withdrawing chamber including therein a cassette elevator for moving upwardly and downwardly a cassette in which a number of shelves are arranged in a vertically spaced relation to receive said articles with predetermined spacing intervals defined thereamong, said withdrawing chamber being connected to atmospheric leak means;
   (f) opening means provided between the adjacent chambers, said opening means being normally closed and opened only when said articles are passed therethrough one by one;
   (g) conveyor means mounted in each of said chambers for horizontally conveying each of said articles as a single body through said opening means; and
   (h) evacuating means connected to each of said chambers;
   (i) said inlet chamber, first intermediate chamber, vacuum treating chamber, second intermediate chamber and withdrawing chamber being arranged successively in a direction in which the articles are successively transferred;
   (j) the apparatus being constructed such that, while the number of articles in said inlet chamber and said withdrawing chamber are being subject, collectively, to the evacuation treatment, the articles received in the cassette in said first intermediate chamber are taken out successively one by one and horizontally conveyed by said conveyor means and the respective articles thus successively conveyed are successively subject to the vacuum treatment by said vacuum treating means and then conveyed by said conveyor means successively into the cassette in said second intermediate chamber.

2. An apparatus as claimed in claim 1, wherein said vacuum treating chamber includes a treating chamber having heating means mounted therein for effecting baking treatment of said articles, and a sputtering chamber containing therein sputter treating means for effecting sputter treatment of the articles which have been subject to baking treatment in said treating chamber.

3. An apparatus as claimed in claim 2, wherein said treating chamber includes therein means for effecting sputter-etching treatment of said articles.

4. An apparatus for performing continuous treatment in vacuum, comprising:
   (a) an inlet and withdrawing chamber having atmospheric leak means connected thereto and including therein a plurality of cassette elevators for moving upwardly and downwardly each of a plurality of cassettes each having a number of shelves arranged therein in a vertically spaced relation to receive a number of articles with predetermined spacing intervals defined thereamong, said chamber being adapted to subject, collectively, the number of articles received in said cassettes to evacuation treatment;
   (b) an intermediate chamber including therein a plurality of cassette elevators for moving upwardly and downwardly each of a plurality of cassettes each having a number of shelves arranged therein in a vertically spaced relation to receive the number of the articles with predetermined spacing intervals defined thereamong, said intermediate chamber cassettes including a first cassette for receiving the number of the articles not yet subjected to vacuum treatment and a second cassette for receiving the articles having been subjected to the vacuum treatment;

(c) a vacuum treating chamber having at least one vacuum treating means mounted therein;

(d) opening means provided between the adjacent chambers, said opening means being normally closed and opened only when said articles are to be passed therethrough successively one by one;

(e) conveyor means mounted in each of said chambers for horizontally conveying each of said articles as a single body through said opening means; and (f) evacuating means connected to each of said chambers;

(g) said respective chambers being arranged such that the articles may be transferred successively from the inlet and withdrawing chamber, through the intermediate chamber, to the vacuum treating chamber, and then from the latter vacuum treating chamber, through the intermediate chamber, to the inlet and withdrawing chamber;

(h) the apparatus being constructed such that, while the number of articles in said inlet and withdrawing chamber are being subject, collectively, to the evacuation treatment, the articles received in said first cassette in said intermediate chamber are taken out successively one by one and conveyed horizontally by said conveyor means and the respective articles thus successively conveyed are successively subject to the vacuum treatment by said vacuum treating means in said vacuum treating chamber and then conveyed by said conveyor means successively into said second cassette in said intermediate chamber.

5. An apparatus as claimed in claim 4, wherein said vacuum treating chamber includes a treating chamber having heating means mounted therein for effecting baking treatment of said articles, and a sputtering chamber containing therein sputter treating means for effecting sputter treatment of the articles which have been subjected to baking treatment in said treating chamber.

6. An apparatus as claimed in claim 5, wherein said treating chamber includes therein means for effecting sputter-etching treatment of said articles.

7. An apparatus as claimed in any one of claims 4 to 6, further comprising outside storing means provided adjacent the inlet side and outlet side, respectively, of said inlet and withdrawing chamber, each of said storing means including a cassette elevator for moving upwardly and downwardly the cassette receiving therein the number of the articles.

8. An apparatus as claimed in one of claims 2, 3, 5 or 6, wherein said sputtering chamber includes therein means for bringing each of said articles to a substantially upright position in which it faces said sputter treating means, so as to enable to effect side sputtering.

9. An apparatus for performing continuous treatment in vacuum, comprising:

(a) an inlet chamber, an intermediate chamber, and at least one vacuum treating chamber having at least one vacuum treating means therein, arranged in the indicated order in a direction in which base plates are successively transferred;

(b) opening means in a wall at the inlet of said inlet chamber, and between adjacent chambers, said opening means being normally closed, and being opened only when each base plate is transferred therethrough;

(c) base plate storing means located in each of said inlet and intermediate chambers for receiving and storing a plurality of base plates;

(d) a first conveyor means located exclusively within the confines of said inlet chamber, first conveyor means being constructed and arranged for successively, directing receiving each base plate from the base plate storing means in said inlet chamber and, without leaving said confines, transferring only each base plate so received through the opening means in the wall between the inlet means and the successively adjacent chamber;

(e) second conveyor means located exclusively within the confines of said intermediate chamber, said second conveyor means being constructed and arranged for directly receiving and conveying each base plate, transferred into said intermediate chamber, into the intermediate chamber base plate storing means and for directly receiving and conveying each base plate from the intermediate chamber base plate storing means and conveying only each base plate into the successively next chamber, without leaving said intermediate chamber confines; and (f) third conveying means located exclusively within the confines of the vacuum treating chamber for receiving each base plate transferred therein and for conveying each base plate out of the vacuum treating chamber after treating thereof.

10. An apparatus according to claim 9, further comprising a second intermediate chamber and a withdrawing chamber successively, located downstream of said vacuum treating chamber, in a direction of travel of said base plates; base plate storing means located in each of said second intermediate chamber and said withdrawing chamber; fourth and fifth conveying means located exclusively within the confines of said second intermediate and withdrawing chambers, respectively, for directly receiving and conveying each base plate, received into the respective chamber, into the respective base plate storing means, and for receiving each base plate from the respective storing means and conveying same out of the respective chamber without leaving the confines thereof.

11. An apparatus according to claim 9, wherein the inlet chamber also serves as an outlet chamber, said inlet chamber and intermediate chamber having separate base plate storing means for separately storing incoming untreated and outgoing treated base plates.

12. An apparatus according to one of claims 9, 10 or 11, wherein said base plate storing means comprises magazines having receiving shelves which are displaceable into and out of cooperative alignment with a respective one of the conveyor means.

* * * * *